(12) United States Patent
Takanashi et al.

(10) Patent No.: US 7,264,674 B2
(45) Date of Patent: Sep. 4, 2007

(54) METHOD FOR PULLING A SINGLE CRYSTAL

(75) Inventors: Keiichi Takanashi, Nishinomiya (JP); Tokuji Maeda, Kishima-gun (JP); Ken Hamada, Saga (JP)

(73) Assignee: Sumitomo Mitsubishi Silicon Corporation, Tokyo (JP)

( * ) Notice: Subject to any disclaimer, the term of this patent is extended or adjusted under 35 U.S.C. 154(b) by 255 days.

(21) Appl. No.: 10/923,864

(22) Filed: Aug. 24, 2004

(65) Prior Publication Data

US 2005/0022722 A1 Feb. 3, 2005

Related U.S. Application Data

(63) Continuation of application No. 09/867,628, filed on May 31, 2001, now abandoned.

(30) Foreign Application Priority Data

May 31, 2000 (JP) .............................. 2000-161371

(51) Int. Cl.
*C30B 15/20* (2006.01)
(52) U.S. Cl. .............................. 117/15; 117/13; 117/14
(58) Field of Classification Search .................. 117/13, 117/14, 15
See application file for complete search history.

(56) References Cited

U.S. PATENT DOCUMENTS

| | | | |
|---|---|---|---|
| 3,980,438 A * | 9/1976 | Castonguay et al. | 117/202 |
| 5,286,461 A * | 2/1994 | Koziol et al. | 117/201 |
| 5,437,242 A * | 8/1995 | Hofstetter et al. | 117/14 |
| 5,746,825 A | 5/1998 | Von Ammon et al. | |
| 5,882,402 A | 3/1999 | Fuerhoff | |
| 5,935,322 A | 8/1999 | Shimomura et al. | |
| 5,961,716 A * | 10/1999 | White et al. | 117/14 |
| 6,030,451 A | 2/2000 | LaBrie et al. | |

* cited by examiner

*Primary Examiner*—Yogendra N. Gupta
*Assistant Examiner*—Matthew J. Song
(74) *Attorney, Agent, or Firm*—Wenderoth, Lind & Ponack, L.L.P.

(57) ABSTRACT

An apparatus is used to pull a single crystal, wherein a flow of an inert gas to the single crystal to be grown, a pressure in an apparatus body, and a temperature environment are always kept constant by keeping a melt level at a prescribed position in spite of changes in volume of a quartz crucible between batches and thermal deformation of the quartz crucible, so that high quality single crystals can be pulled. The apparatus has a reference reflector arranged inside an apparatus body, a level position measuring unit to measure an actual level position by detecting a mirror image position of the reference reflector reflected in the melt surface using a one-dimensional CCD camera arranged outside the apparatus body, a crucible ascent speed adjustment value calculating unit to calculate an adjustment value of the crucible ascent speed based on an output from the level position measuring unit, an adjustment value adding unit to add the adjustment value to the crucible ascent speed, and a level position controlling unit to control the level position in the crucible by controlling a motor for crucible lifting based on an output from the adjustment value adding means to control the crucible ascent speed.

5 Claims, 4 Drawing Sheets

METHOD FOR PULLING A SINGLE CRYSTAL

This application is a continuation application of Ser. No. 09/867,628, filed May 31, 2001 now abandoned.

BACKGROUND OF THE INVENTION

1. Field of the Invention

The present invention relates to an apparatus for pulling a single crystal and, more particularly, to an apparatus for pulling a single crystal used for pulling a single crystal of silicon or the like from a melt of a material for forming a crystal by a pulling method such as the Czochralski method (hereinafter, referred to as the CZ method).

2. Description of the Relevant Art

At present, the majority of silicon single crystals used for manufacturing a substrate for forming a circuit component of a LSI (large scale integrated circuit) and the like have been pulled by the CZ method. FIG. 3 is a diagrammatic sectional view of a conventional apparatus for pulling a single crystal used for the CZ method, and in the Figure, reference numeral 21 represents a crucible.

The crucible 21 comprises a bottomed cylindrical quartz crucible 21a and a bottomed cylindrical graphite crucible 21b fitted on the outer side of the quartz crucible 21a. The crucible 21 is supported with a support shaft 28 which rotates in the direction shown by the arrow A in the Figure at a prescribed speed. A heater 22 of a resistance heating type and a heat insulating mold 27 arranged around the heater 22 are concentrically arranged around the crucible 21. The crucible 21 is charged with a melt 23 of a material for forming a crystal which is melted by the heater 22. On the central axis of the crucible 21, a pulling shaft 24 made of a pulling rod or wire is suspended, and at the front thereof, a seed crystal 35 is held by a holder 24a. These members are arranged within a water cooled type apparatus body 29 wherein pressure can be controlled.

A window 29a is formed in the middle portion in the height direction of the apparatus body 29. Above the window 29a in a slanting direction, a one-dimensional CCD camera 11 is arranged in such a position that a single crystal 36 during pulling can be seen through the window 29a, and the one-dimensional CCD camera 11 is connected to a diameter measuring means 8 of the single crystal 36. The diameter measuring means 8 is connected to a crucible ascent speed calculating means 9, which captures an input value of the pulled single crystal 36 from the diameter measuring means 8 and information on the pulled length from a pulling means 5 of the pulling shaft 24 to calculate a decrease in volume of the melt within the crucible 21, so as to calculate an ascent speed of the crucible 21 based on the decrease in the melt volume.

A method for pulling a single crystal 36 using the above apparatus for pulling a single crystal is described with reference to FIGS. 3 and 4(a)-(d). FIGS. 4(a)-4(d) are partial enlarged front views diagrammatically showing a seed crystal and the vicinity thereof in part of the steps in pulling a single crystal.

Although it is not shown in FIGS. 4(a)-(d), the pressure within the apparatus body 29 is reduced, and an inert gas is introduced into the apparatus body 29 so as to make an inert gas atmosphere under reduced pressure therein. Then, the material for forming a crystal is melted by the heater 22 and is maintained for a period of time so as to sufficiently release gas contained in the melt 23. While the pulling shaft 24 is rotated on the same axis in the reverse direction of the support shaft 28 at a prescribed speed, the seed crystal 35 held by the holder 24a is caused to descend and is brought into contact with the melt 23. After the front portion of the seed crystal 35 is partially melted into the melt 23, the single crystal 36 begins to be pulled from the melt (the seeding step) (FIG. 4(a)).

In making a crystal grow at the front of the seed crystal 35, the pulling shaft 24 is pulled at a higher speed than the below-described formation speed of a main body 36c, and the crystal is narrowed to have a prescribed diameter, leading to the formation of a neck 36a (the necking step) (FIG. 4(b)). By slowing down the pulling speed of the pulling shaft 24 (hereinafter, simply referred to as the pulling speed), the neck 36a is made to grow to have a prescribed diameter, leading to the formation of a shoulder 36b (the shoulder formation step) (FIG. 4(c)). By pulling the pulling shaft 24 at a fixed rate, the main body 36c having a uniform diameter and a prescribed length is formed (the main body formation step) (FIG. 4(d)).

Furthermore, although it is not shown in FIG. 4, in order to prevent induction of high density dislocation to the single crystal 36 by a steep temperature gradient at the end, the diameter of the single crystal 36 is gradually decreased and the temperature of the whole single crystal 36 is gradually lowered, leading to the formation of an end-cone. Then, the single crystal 36 is separated from the melt 23. After the above steps, cooling the single crystal 36 leads to the completion of pulling the single crystal 36.

In pulling the single crystal 36, in order to obtain a good quality single crystal 36, it is necessary to drive the support shaft 28 using a motor 10 for crucible elevating to move up the crucible 21 up to control the position of the crucible 21 so that the melt surface is always kept in a fixed position with respect to the heater 22. In the crucible ascent control, a method wherein the amount of ascent of the crucible 21 is calculated by calculating a decrease in volume of the melt 23 from the volume of the pulled single crystal 36 has been generally used. Since the amount of ascent of the crucible 21 is calculated by calculating the decrease in volume of the melt 23 from the volume of the pulled single crystal 36 in the above crucible ascent control, the accurate volume of the pulled single crystal 36 needs to be obtained. In addition, in order to calculate the accurate amount of the crucible ascent from the decrease in volume of the melt 23, the accurate internal diameter of the crucible is required. However, in actual pulls, errors are introduced to the crucible ascent control by errors in measuring crystal weight and crystal diameters, changes in the internal diameter of the quartz crucible 21a due to softening thereof during pulling, and changes in the internal diameter of the quartz crucible 21a between batches originating in variations in manufacturing the quartz crucible 21a. Therefore, it is necessary to actually measure to control the level position during pulling the single crystal 36.

In order to solve the above problems, a method for measuring the level position has been disclosed in Japanese Kokai No. 63-281022. In the method for measuring the level position, the level position is calculated from the position of the mirror image of a radiation screen reflected in the melt surface. The method makes it possible to measure the level position during crystal pulling. Similar to the method disclosed in the above publication, a method wherein the level position is controlled based on the mirror image position of a radiation screen reflected in the melt surface has been disclosed in Japanese Kokai No. 07-277879. In the method, by moving a crucible up and down so that the mirror image position of the radiation screen is kept fixed, the level position is controlled so as to be kept fixed.

However, in these methods, the inclination of the melt surface in which the mirror image of the radiation screen is reflected causes a change of the mirror image position even when the level position does not actually change, leading to the erroneous recognition and control of the level position. Factors of the inclination of the melt surface are changes in crystal diameter and changes in crucible rotational speed. Therefore, errors arise with changes in crystal diameter and changes in crucible rotational speed when the level position is controlled based on only the mirror image position of the radiation screen.

Particularly, the shoulder formation step wherein the crystal diameter is increased to a desired diameter from the seed crystal is a problem. In the shoulder formation step, the inclination of the melt surface increases with an increase in crystal diameter. Therefore, when the level position control by which the mirror image position of the radiation screen is kept fixed is conducted in the shoulder formation step, the actual level positions before and after the shoulder formation step become different.

The same errors are also caused by changes in crystal diameter in the main body formation step. In addition, when the level position control is conducted based on only the mirror image position of the radiation screen on the melt surface, the occurrence of irregularity in measuring the level position makes it impossible to carry out the ascent/descent control of the crucible 21.

SUMMARY OF THE INVENTION

The present invention was accomplished in order to solve the above problems, and it is an object of the present invention to provide an apparatus for pulling a single crystal, wherein a flow of an inert gas to a single crystal to be grown, pressure in an apparatus body, and a temperature environment are always kept constant by keeping the melt level at a prescribed position in spite of changes in volume of a quartz crucible between batches and thermal deformation of the quartz crucible, so that high quality single crystals can be pulled. In order to achieve the above object, an apparatus for pulling a single crystal (1) according to the present invention is an apparatus for pulling a single crystal which has a lifting means of a crucible and a level position controlling means to control the level position in the crucible by calculating a crucible ascent speed based on a decrease in volume of a melt with pulling a single crystal so as to control the lifting means. The apparatus comprises a reference reflector arranged inside an apparatus body, a level position measuring means to measure an actual level position by detecting a mirror image position of the reference reflector reflected in the melt surface using an optical device arranged outside the apparatus body, a crucible ascent speed adjustment value calculating means to calculate an adjustment value of the crucible ascent speed based on an output from the level position measuring means, an adjustment value adding means to add the adjustment value to the crucible ascent speed, and the level position controlling means to control the level position in the crucible by controlling the lifting means based on an output from the adjustment value adding means so as to control the crucible ascent speed.

By using the above apparatus for pulling a single crystal (1), having the reference reflector, the level position measuring means, the crucible ascent speed adjustment value calculating means and the adjustment value adding means, the crucible ascent speed is controlled by controlling the lifting means based on the output from the adjustment value adding means by the level position controlling means, while the level position in the crucible is controlled by calculating the crucible ascent speed based on the decrease in volume of the melt with single crystal pulling to control the lifting means by the level position controlling means. Therefore, even if the quartz crucible softens about the melting point of silicon and becomes deformed during pulling, the level position in the crucible can be controlled with high accuracy.

An apparatus for pulling a single crystal (2) according to the present invention comprises an adjustment value addition propriety judging means to judge the propriety of adding the adjustment value to the crucible ascent speed, based on a diameter of a pulling crystal, a level position measured by the level position measuring means, a distance between the crystal and the reference reflector, and a crucible rotational speed in the apparatus for pulling a single crystal (1). Using this apparatus for pulling a single crystal (2), whether the adjustment value should be added to the crucible ascent speed or not is judged by the adjustment value addition propriety judging means, based on the diameter of a pulling crystal, the level position measured by the level position measuring means, the distance between the crystal and the reference reflector, and the crucible rotational speed. These items are the chief factors for determining the inclination of the melt surface in the process of single crystal pulling. A situation where the selected values thereof for judgement are not satisfied under pulling conditions indicates that the inclination of the melt surface is not suitable for measuring the level position, and that the measurement result is significantly affected by the inclination of the melt surface. In this case, the adjustment value calculated from the level position measuring means is not added to the crucible ascent speed. Furthermore, even when there is such a problem in measuring the actual level position by detecting the mirror image position of the reference reflector reflected in the melt surface using the optical device arranged outside the apparatus body, the control wherein the level position in the crucible is controlled by calculating the crucible ascent speed based on the decrease in volume of the melt with single crystal pulling so as to control the lifting means is carried out. As a result, the influence of not adding the adjustment value to the crucible ascent speed on the level position change can be kept to a minimum.

An apparatus for pulling a single crystal (3) according to the present invention comprises an averaging means to average level positions measured by the level position measuring means in the apparatus for pulling a single crystal (1) or (2). By using this apparatus for pulling a single crystal (3), it is possible to negate the effect of fluctuation of the melt surface. Another factor of errors in measuring the actual level position by detecting the mirror image position of the reference reflector reflected in the melt surface using the optical device arranged outside the apparatus body is the fluctuation of the melt surface. The fluctuation of the melt surface during measurement causes variations in measurement. The effect of the fluctuation of the melt surface can be negated by the action of the averaging means to average the level positions measured by the level position measuring means. It is desired that a period of time for averaging should be set in the range of 1 to 30 minutes or so.

An apparatus for pulling a single crystal (4) according to the present invention has an optical device constituting the level position measuring means being also used as an optical device for measuring a crystal diameter in any of the apparatus for pulling the single crystal (1)-(3). By using this apparatus for pulling a single crystal (4), the cost of manufacturing an apparatus for pulling a single crystal can be held down by using the optical device constituting the level position measuring means as the optical device for measuring a crystal diameter.

An apparatus for pulling a single crystal (5) according to the present invention comprises an automatic updating means to work out a conversion equation for converting a mirror image position of the reference reflector on the melt surface to an actual level position by automatically moving the crucible up and down from the initial position thereof. This movement allows attainment of the relationship between the mirror image position of the reference reflector on the melt surface and the level position and making the relationship approximate to a straight line in any of the apparatus for pulling the single crystal (1)-(4).

Variations in the setting position of the optical device for detecting the mirror image position of the reference reflector and the setting position of the reference reflector are also factors of measurement errors in relation to the level position measurement. If the setting situations thereof do not change, it might be possible to accurately calculate the level position from the mirror image position of the reference reflector based on a conversion equation worked out from the geometric arrangement beforehand, but this is actually difficult. Therefore, a conversion equation of the mirror image position of the reference reflector to the level position in the actual setting situations is required. Using the above apparatus for pulling the single crystal (5), having the automatic updating means to automate the activity of working out the conversion equation, it is possible to automatically find the conversion equation before crystal pulling by using the automatic updating means.

DETAILED DESCRIPTION OF THE PREFERRED EMBODIMENTS

The preferred embodiments of the apparatus for pulling a single crystal according to the present invention are described below by reference to the Figures.

Figure 1:
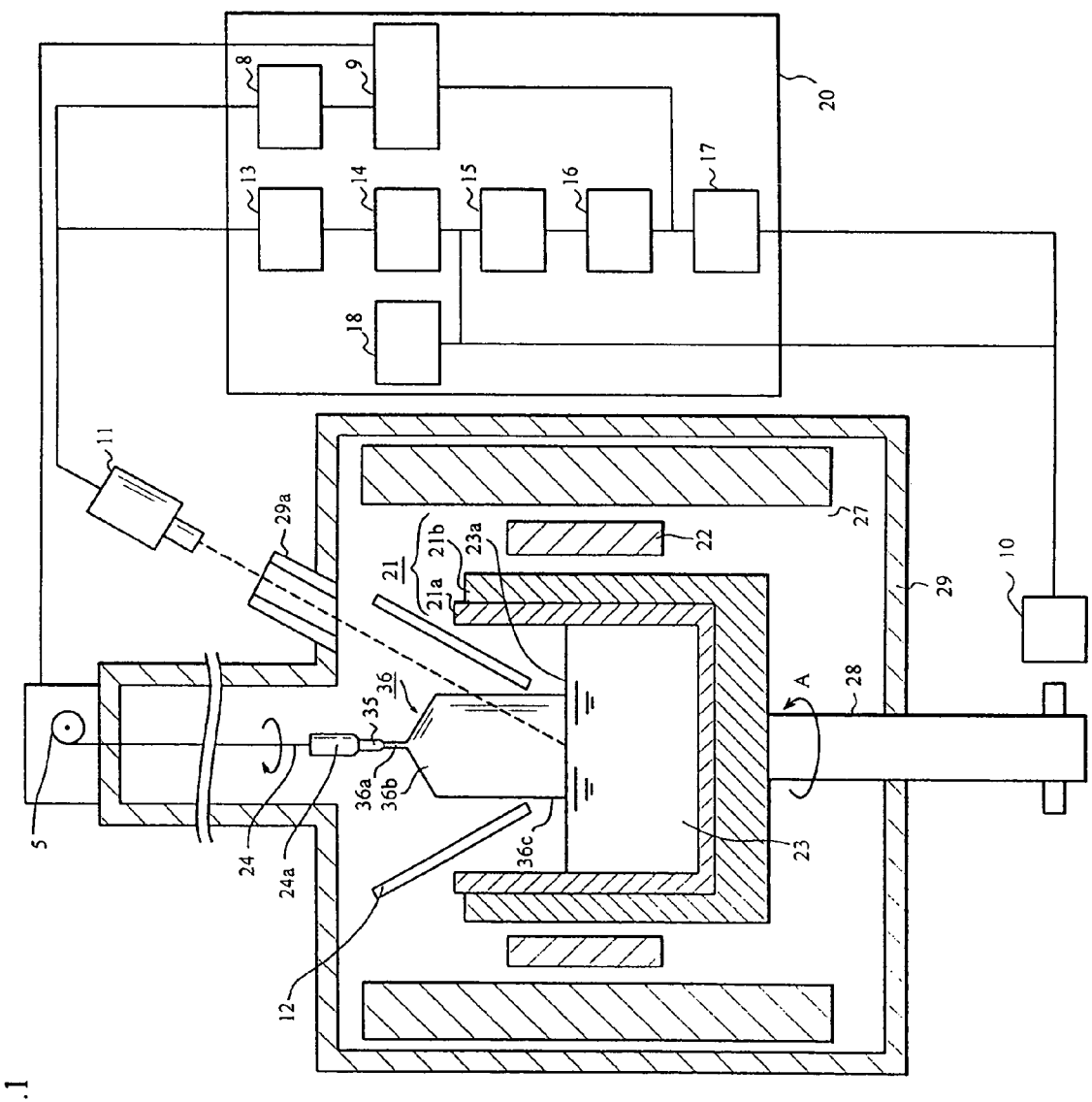
FIG. 1 is a diagrammatic sectional view showing an apparatus for pulling a single crystal according to an embodiment of the present invention.

FIG. 1 is a diagrammatic sectional view of an apparatus for pulling a single crystal according to an embodiment, and in the Figure, reference numeral 21 represents a crucible which is vertically movable. The crucible 21 comprises a bottomed cylindrical quartz crucible 21a and a bottomed cylindrical graphite crucible 21b fitted on the outer side of the quartz crucible 21a. The crucible 21 is supported with a support shaft 28 which rotates in the direction shown by the arrow A in the Figure at a prescribed speed. A heater 22 of a resistance heating type and a heat insulating mold 27 arranged around the heater 22 are concentrically arranged around the crucible 21. The crucible 21 is charged with a melt 23 of a material for forming a crystal which is melted by the heater 22. On the central axis of the crucible 21, a pulling shaft 24 made of a pulling rod or wire is suspended, and at the front thereof, a seed crystal 35 is held by a holder 24a. These members are arranged within a water cooled type apparatus body 29 wherein pressure can be controlled.

A window 29a is formed in the middle portion in the height direction of the apparatus body 29. Above the window 29a in a slanting direction, a one-dimensional CCD camera 11 is arranged in such a position that a single crystal 36 can be seen through the window 29a during pulling and the one-dimensional CCD camera 11 is connected to both a diameter measuring means 8 of the single crystal 36 and a level position measuring means 13. The one-dimensional CCD camera 11 has the function of measuring a diameter of the single crystal 36 as well as the function of measuring the level position of the melt 23. In the measurement of the level position, a two-dimensional CCD camera can be adopted in place of the one-dimensional CCD camera 11. Another CCD camera specifically for measuring the level position can be placed beside the one-dimensional CCD camera 11 for the diameter measuring means 8.

Above the crucible 21 within the apparatus body 29, a reference reflector 12 for detecting the level position is arranged, which also serves as a radiation screen to control the thermal history of the pulled single crystal 36. The reference reflector 12 is placed 22 mm or more apart from the straight body portion of the single crystal 36. It is also possible to use the reference reflector 12 separate from a radiation screen.

The one-dimensional CCD camera 11 is connected to the diameter measuring means 8, which is connected to a crucible ascent speed calculating means 9. The crucible ascent speed calculating means 9 captures an input value from the diameter measuring means 8 of the pulled single crystal 36 and information on the pulled length from a pulling means 5 of the pulling shaft 24 to calculate a decrease in volume of the melt within the crucible 21, so as to calculate an ascent speed of the crucible 21 based on the decrease in volume of the melt.

Besides the diameter measuring means 8, the level position measuring means 13 is also connected to the one-dimensional CCD camera 11. The level position measuring means 13 receives an output from the one-dimensional CCD camera 11 to calculate the level position from the mirror image position of the reference reflector 12 reflected in the melt surface 23a of the melt 23. To the level position measuring means 13, both an averaging means 14 and an automatic updating means 18 are connected. The averaging means 14 receives an output from the level position measuring means 13 to average the measured values in a prescribed period of time, which is desirable to be set in the range of 1 to 30 minutes or so.

The automatic updating means 18 is used for automatically working out a conversion equation for converting the mirror image position of the reference reflector 12 on the melt surface 23a to the actual level position by automatically moving the crucible 21 up and down from the initial position thereof to obtain the relationship between the mirror image position of the reference reflector 12 on the melt surface 23a and the level position and making the relationship approximate to a straight line. Variations in the setting position of the one-dimensional CCD camera 11 for detecting the mirror image position of the reference reflector 12 and the setting position of the reference reflector 12 are also factors of measurement errors in the level position measurement. If the setting situations thereof do not change, it might be possible to calculate the level position from the mirror image position of the reference reflector 12 based on a conversion equation worked out from the geometric arrangement beforehand, but this is actually difficult. Therefore, a conversion equation of the mirror image position of the reference reflector 12 to the level position in the actual setting situations is obtained by the automatic updating means 18.

In the present embodiment, the level position is actually changed by moving the crucible 21 up and down after the melting of a material for forming a crystal is completed and the initial level position becomes stable, and a conversion equation is obtained by making the relationship between the mirror image position of the reference reflector 12 and the level position approximate to a straight line using the automatic updating means 18. It is desired that the ascent/descent range of the crucible 21 at that time should be set to be ±5 mm to the initial position.

A crucible ascent speed adjustment value calculating means 15 is connected to the averaging means 14. By the crucible ascent speed adjustment value calculating means 15, an adjustment value for adjusting the control error of the melt position which arises in the case of the control being based on a crucible ascent speed calculated in the crucible ascent speed calculating means 9 is calculated. How to calculate the adjustment value is that after the measured value of the level position, at the first point when it is judged to be able to be added by a below-described adjustment value addition propriety judging means 16, is set to be the initial position, an adjustment value of the crucible ascent speed is calculated by calculating the level position shifted from the initial position. The adjustment value addition propriety judging means 16 to judge the irregularity in measuring the level position is connected to the crucible ascent speed adjustment value calculating means 15. The criteria for judgement in the adjustment value addition propriety judging means 16 are: the upper and lower limits of a crystal diameter are within the range of ±2 mm to a desired diameter of a main body 36c of the single crystal 36; the upper and lower limits of the level position are within the range of ±5 mm to the initial value of the level position; the lower limit of the distance between the single crystal 36 and the reference reflector 12 is 22 mm; and the upper and lower limits of the rotational speed of the crucible 21 are within the range of ±10 rpm to the rotational speed of the crucible 21 at the starting point of pulling the main body 36c of the single crystal 36. When these conditions are not satisfied, the adjustment value calculated in the crucible ascent speed adjustment value calculating means 15 is not allowed to be added to the ascent speed of the crucible 21 calculated in the crucible ascent speed calculating means 9 by an adjustment value adding means 17. In the settings of the present embodiment, the above upper and lower limits of the crystal diameter do not satisfy the condition of within the range of ±2 mm to a desired diameter of the main body 36c of the single crystal 36 during a pulling of a shoulder 36b of the single crystal 36. Therefore, the level position control is performed based on the crucible ascent speed calculated in the crucible ascent speed calculating means 9. However, the shoulder 36b of the single crystal 36 is very small in volume, so that the control error of the level position thereby can be kept in a very small range.

According to the above construction, in the apparatus for pulling a single crystal according to the embodiment, two systems of controlling the level position during pulling the single crystal 36, a crucible ascent speed based on a decrease in volume of the melt 23 with pulling the single crystal 36 and an output from the crucible ascent speed adjustment value calculating means 15 based on the measurement result of the level position measured from the mirror image position of the reference reflector 12 on the melt surface 23a, are included.

In the apparatus for pulling a single crystal according to the embodiment, as one system, the level position is controlled by calculating the ascent speed of the crucible 21 from both the measured value of the crystal diameter of the single crystal 36 and the pulling speed thereof. The crucible ascent speed is calculated based on the below equation (1).

$$V_f = (D_{si}^2 P_s / D_{cur}^2 P_L) \times (V_{si} - V_{cur}) + V_{cur} \qquad (1)$$

where $V_f$: crucible ascent speed
$P_s$: specific gravity of solid silicon
$P_L$: specific gravity of liquid silicon
$D_{si}$: crystal diameter
$D_{cur}$: quartz crucible internal diameter
$V_{si}$: crystal pulling speed
$V_{cur}$: preceding crucible ascent speed Thus, an accurate value of the internal diameter of the quartz crucible 21a is required for calculating the crucible ascent speed. However, in some cases, the quartz crucible 21a softens at about the melting point of silicon and becomes deformed during pulling. Therefore, in the apparatus for pulling a single crystal according to the embodiment, the level position is measured from the mirror image position on the melt surface 23a of the reference reflector 12 arranged inside the apparatus body 29, and the control error in the level position control based on the crucible ascent speed calculated from the decrease of the melt 23 is calculated. Then, an adjustment value of the ascent speed of the crucible 21 is calculated from the calculated control error and is added to the crucible ascent speed, so that the level position is controlled thereby with higher accuracy. The crucible ascent speed adjustment value is calculated based on the below equation (2).

$$V(\text{mm/min}) = V_f(\text{mm/min}) + V_{adj}(\text{mm/min}) \qquad (2)$$

$$V_{adj} = \Sigma \Delta V_{adj}(i)$$

$$\Delta V_{adj}(i) = P \times \{H_i(\text{mm}) - H_{i-1}(\text{mm})\} + I \times \{H_i(\text{mm}) - H_0(\text{mm})\} + D \times \{H_i(\text{mm}) - 2H_{i-1}(\text{mm}) + H_{i-2}(\text{mm})\}$$

where V: crucible ascent speed after adjusting level position change
$V_{adj}$: crucible ascent speed adjustment value
$V_f$: crucible ascent speed
$H_0$: reference level position
$H_i$: ith measured value of level position
P, I, D: control constants
$P_s$: specific gravity of solid silicon
$P_L$: specific gravity of liquid silicon However, in some cases, errors are introduced to the level position measurement from the mirror image position of the reference reflector 12 on the melt surface 23a. The prime cause of the measurement errors is the inclination of the melt surface 23a. When the inclination of the melt surface 23a changes during measurement, the mirror image position of the reference reflector 12 reflected in the melt surface 23a changes, resulting in an error in measuring the level position. The inclination of the melt surface 23a is varied by two factors.

The first factor is the surface tension caused by pulling the single crystal 36. During crystal pulling, the melt surface 23a is lifted by the surface tension and becomes inclined. The melt surface 23a closer to the single crystal 36 is more inclined, while the melt surface 23a further from the single crystal 36 is less inclined. Therefore, the larger the crystal diameter becomes, the greater the mirror image position of the reference reflector 12 during crystal pulling is influenced by the inclination of the melt surface 23a. Here, the inclination of the melt surface 23a on the same melt surface 23a does not change when the distance between the single crystal 36 and the reference reflector 12 is fixed. Therefore, the measurement error of the level position caused by the change of the inclination of the melt surface 23a during crystal pulling is influenced by the change of the crystal diameter and the change of the crystal position during pulling.

The second factor of changing the inclination of the melt surface 23a is the influence of centrifugal force which arises with the rotation of the crucible 21. Since the melt 23 within the crucible 21 rotates with the rotation of the crucible 21, the melt 23 is pushed to the outer regions by the centrifugal force, leading to the inclination of the melt surface 23a. Since the inclination is chiefly determined by the rotational speed of the melt 23, the inclination of the melt 23a changes with the change of the rotational speed of the crucible 21 during pulling, so that the mirror image position of the reference reflector 12 also changes.

Therefore, in the adjustment value addition propriety judging means 16 of the ascent speed of the crucible 21 of the apparatus according to the embodiment, whether adding the adjustment value is right or not is judged based on the selected upper and lower limits of the crystal diameter, the upper and lower limits of the level position, the selected lower limit of the distance between the single crystal 36 and the reference reflector 12, and the selected upper and lower limits of the rotational speed of the crucible 21, which are factors of changing the inclination of the melt 23a, so that the measurement error caused by the change of the inclination of the melt 23a is allowable.

Another factor of errors in relation to the measurement of the level position is fluctuation of the melt surface 23a. When the melt surface 23a fluctuates during measurement, variations in measurement are caused. The influence of the fluctuation of the melt surface 23a can be negated by the operation of the averaging means 14 to average the measured values of the level positions. It is appropriate that the period of time for averaging should be set in the range of 1 to 30 minutes or so.

Variations in the setting position of the one-dimensional CCD camera 11 for detecting the mirror image position of the reference reflector 12 and the setting position of the reference reflector 12 are also factors of measurement errors in relation to the level position measurement. If the setting situations thereof do not change, it might be possible to uniformly calculate the level position from the mirror image position of the reference reflector 12 based on a conversion equation worked out from the geometric arrangement beforehand, but this is actually difficult. Therefore, a conversion equation of the mirror image position of the reference reflector 12 to the level position in the actual setting situations of the one-dimensional CCD camera 11 and the reference reflector 12 is required. The conversion equation can be obtained by moving the crucible 21 up and down to change the level position. By using the apparatus for pulling a single crystal according to the embodiment, having the automatic updating means 18 to automate the activity of working out the conversion equation, it is possible to automatically find the conversion equation before pulling the single crystal 36 using the automatic updating means 18.

Since the reference reflector 12 is a structure above and in the proximity of the melt surface 23a, it needs to be made of a material which does not contaminate the melt 23 and can endure high temperatures. As a component of the reference reflector 12, carbon can be exemplified. In addition, if the distance between the single crystal 36 and a radiation screen can be ensured to be above the selected lower limit of the distance between the single crystal 36 and the reference reflector 12, the radiation screen for controlling the thermal history of the single crystal 36 can also be used as the reference reflector 12.

As an optical device for measuring the mirror image position of the reference reflector 12, a normal two-dimensional CCD camera, one-dimensional CCD camera, or the like can be used. When the crystal diameter is measured during crystal pulling using the one-dimensional CCD camera 11 and the reference reflector 12 is placed within the field of view of the measurement, the one-dimensional CCD camera 11 for measuring a crystal diameter can also be used for measuring the level position, if the distance between the single crystal 36 and the reference reflector 12 is ensured to be above the selected lower limit thereof.

Figure 2:
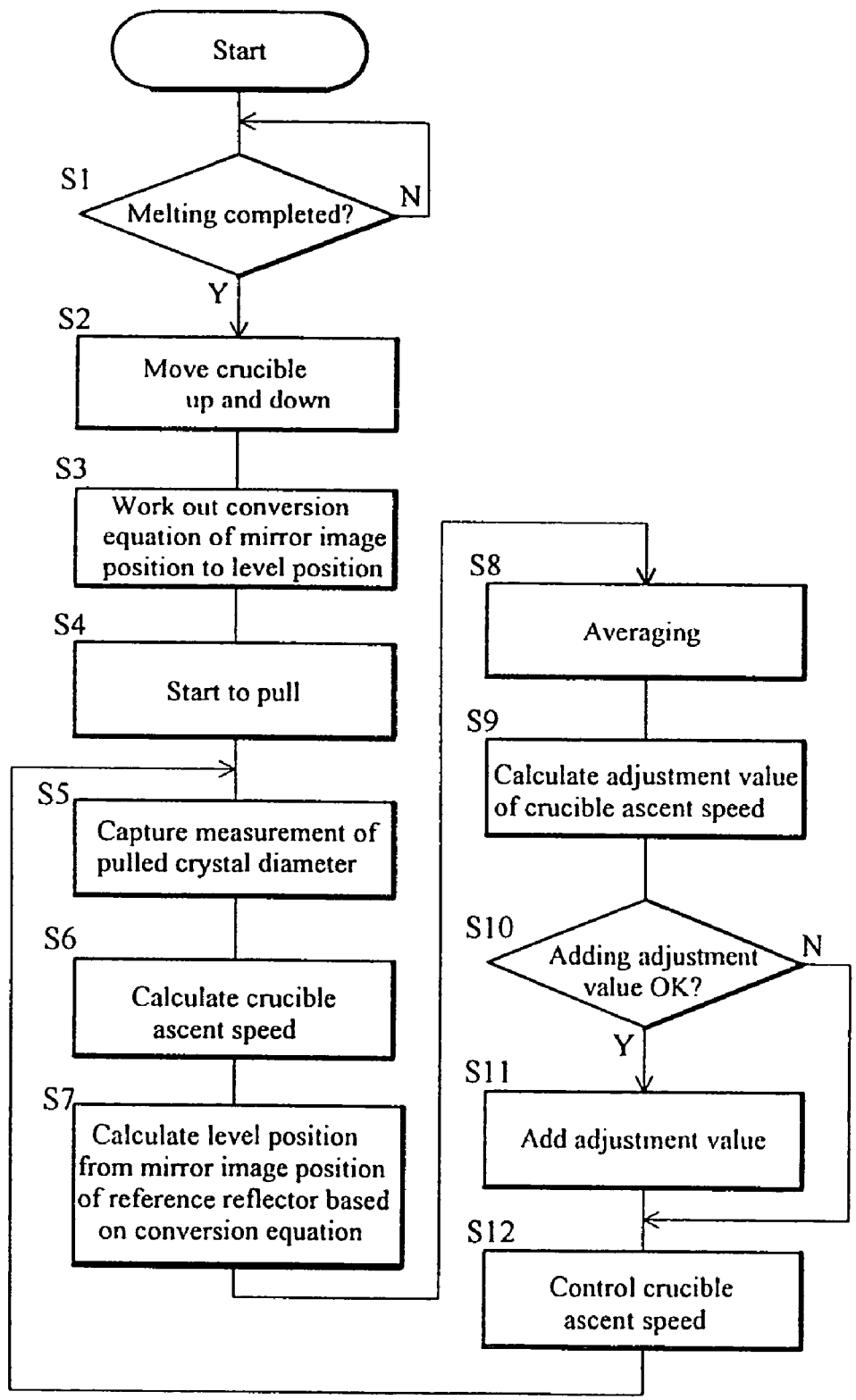
FIG. 2 is a flow chart showing the operation of a level position controlling means in the apparatus for pulling a single crystal according to the embodiment.
Figure 3:
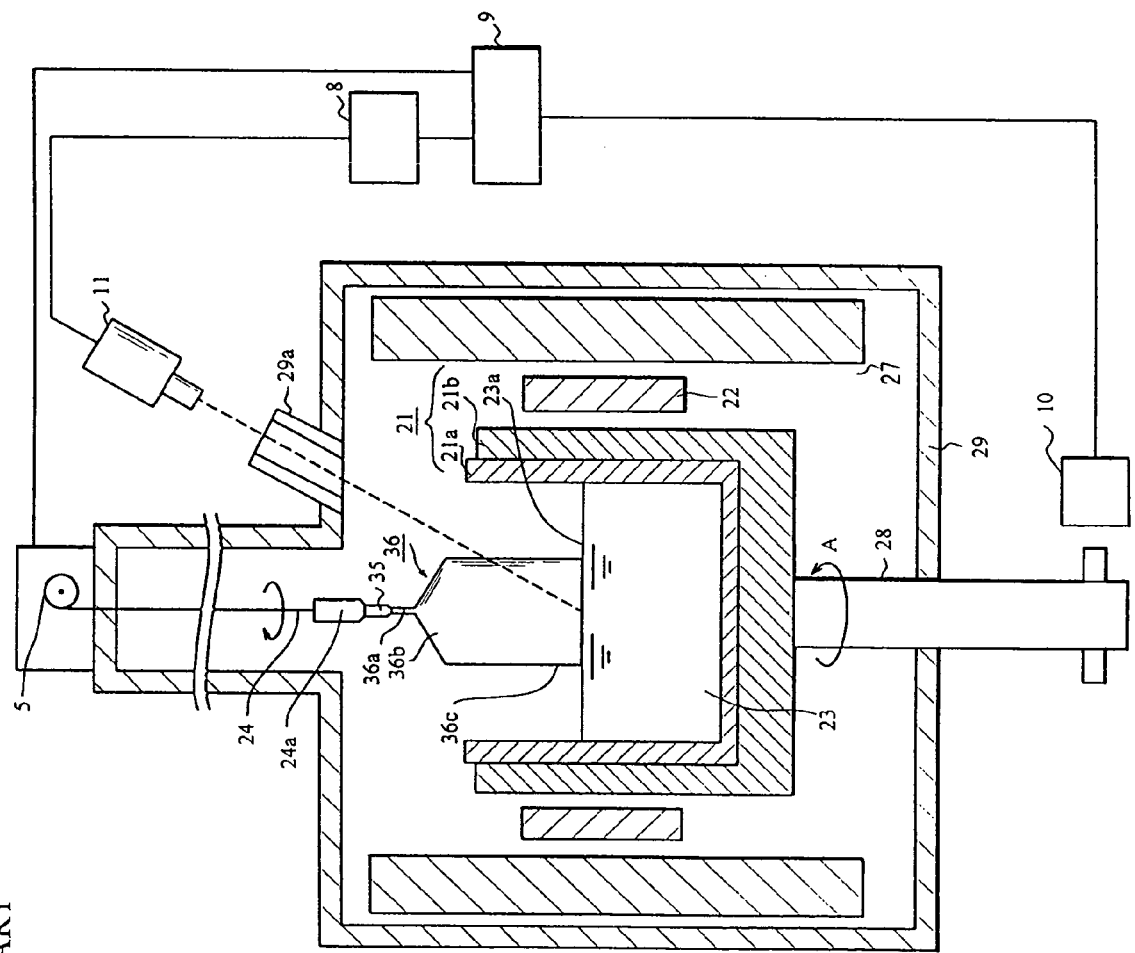
FIG. 3 is a diagrammatic sectional view showing a conventional apparatus for pulling a single crystal.
Figure 4A:
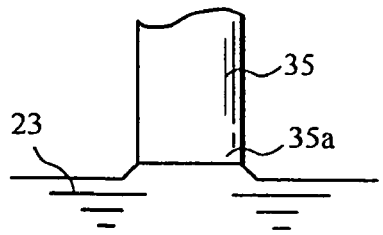
FIGS. 4(a)-4(d) are partial enlarged front views diagrammatically showing a seed crystal and the vicinity thereof in part of the steps in pulling a single crystal.
Figure 4B:
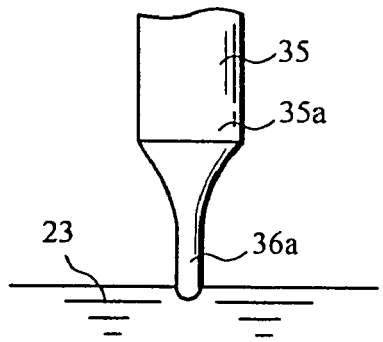
Figure 4C:
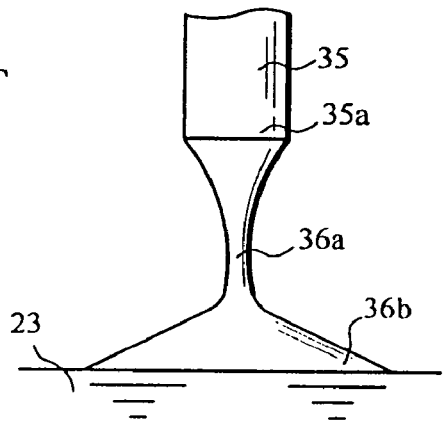
Figure 4D:
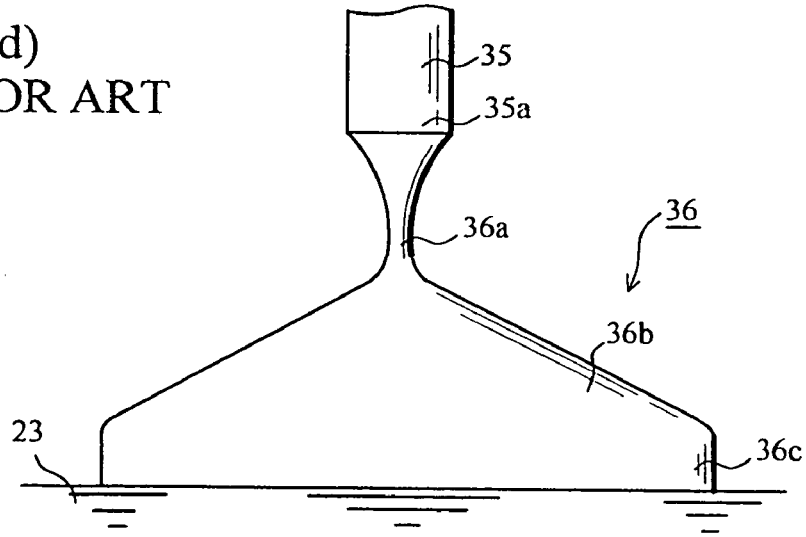

The operation of the level position controlling means 20 of the apparatus for pulling a single crystal according to the embodiment is described below by reference to the flow chart shown in FIG. 2.

In Step 1 (S1), whether the melting of the material for forming a crystal is completed or not is judged. When the melting of the material for forming a crystal is judged not to be completed in S1, the operation waits for the completion of the melting thereof. On the other hand, when the melting of the material for forming a crystal is judged to be completed, the operation proceeds to Step 2 (S2), wherein the crucible 21 is caused to move up and down within the range of ±5 mm to the initial position. Then, the process goes to Step 3 (S3), wherein a conversion equation of the mirror image position to the level position is obtained from the change of the mirror image position of the reference reflector 12 with the ascent/descent of the crucible 21.

After the conversion equation is obtained, pulling of the single crystal 36 is started in Step 4 (S4). With the start of pulling, measured values of the pulling speed of the pulling shaft 24 and the crystal diameter are captured in Step 5 (S5), and the ascent speed of the crucible 21 is calculated based on these values using the equation (1) in Step 6 (S6). Then, the level position is calculated from the mirror image position on the melt surface 23a of the reference reflector 12 placed inside the apparatus body 29 in Step 7 (S7), averaging is conducted on the calculated values of the level positions in Step 8 (S8), and an adjustment value of the ascent speed of the crucible 21 is calculated from the averaged measured value based on the equation (2) in Step 9 (S9).

The operation proceeds to Step 10 (S10), wherein the propriety of adding the adjustment value calculated in Step 9 (S9) to the ascent speed of the crucible 21 is judged. The judgement is carried out based on whether or not the upper and lower limits of the crystal diameter are within the range of ±2 mm to a desired diameter of the main body 36c, the upper and lower limits of the level position are within the range of ±5 mm to the initial level position, the lower limit of the distance between the single crystal 36 and the reference reflector 12 is 22 mm, and the upper and lower limits of the crucible rotational speed are within the range of ±10 rpm to the crucible rotational speed at the early stage of forming the main body 36c. When adding the adjustment value to the ascent speed of the crucible 21 is judged to be acceptable in Step 10 (S10), the operation goes to Step 11 (S11), wherein adding the adjustment value is conducted, and then, the ascent speed of the crucible 21 is controlled based on the adjusted value in Step 12 (S12). On the other hand, when adding the adjustment value to the ascent speed of the crucible 21 is judged to be wrong in Step 10 (S10), Step 11 (S11) is bypassed and the operation goes to Step 12 (S12), wherein the ascent speed of the crucible 21 is controlled based on the value calculated in Step 6 (S6).

By using the apparatus for pulling a single crystal according to the embodiment, it is possible to control the level position in the crucible 21 by the level position controlling means 20, which calculates the crucible ascent speed based on a decrease in the melt volume with the pulling of the single crystal 36 so as to control a motor 10 for crucible lifting. Furthermore, by using the apparatus for pulling a single crystal according to the embodiment, having the reference reflector 12, level position measuring means 13, crucible ascent speed adjustment value calculating means 15, and adjustment value adding means 17, the level position controlling means 20 controls the crucible ascent speed by controlling the motor 10 for crucible lifting based on an output from the adjustment value adding means 17. As a result, even if the quartz crucible 21a softens at about the melting point of silicon and becomes deformed during pulling, the level position in the quartz crucible 21a can be controlled with high accuracy.

By using the apparatus for pulling a single crystal according to the embodiment, the adjustment value addition propriety judging means 16 judges whether adding the adjustment value to the crucible ascent speed is appropriate or not based on the crystal diameter of the pulling single crystal 36, the level position measured by the level position measuring means 13, the distance between the single crystal 36 and the reference reflector 12, and the crucible rotational speed. These items are the chief factors of determining the inclination of the melt surface 23a in the apparatus for pulling a single crystal. Therefore, the situation where the selected values thereof for judgement are not met under pulling conditions indicates that the inclination of the melt surface 23a is not adequate with respect to the level position measurement, and that the measurement result is significantly influenced by the inclination of the melt surface 23a. In this case, the adjustment value calculated from the level position measuring means 13 is not added to the crucible ascent speed. In addition, even if there is such a problem in measuring the actual level position by detecting the mirror image position of the reference reflector 12 reflected in the melt surface 23a using the one-dimensional CCD camera 11 arranged outside the apparatus body 29, the control wherein the level position in the crucible 21 is controlled by calculating the crucible ascent speed based on a decrease in the melt volume with the pulling of the single crystal 36 so as to control the motor 10 for crucible lifting, is conducted, so that the influence on the level position change can be kept to a minimum.

By using the apparatus for pulling a single crystal according to the embodiment, it is possible to negate the influence of fluctuation of the melt surface 23a. Since the mirror image position of the reference reflector 12 reflected in the melt surface 23a is detected using the one-dimensional CCD camera 11 arranged outside the apparatus body 29, another factor of error in the level position measurement wherein the actual level position is measured is the fluctuation of the melt surface 23a. The fluctuation of the melt surface 23a during measurement causes variations in measured values. The effect of the fluctuation of the melt surface 23a is negated by the action of the averaging means 14 to average the level positions measured by the level position measuring means 13.

By using the apparatus for pulling a single crystal according to the embodiment, wherein the one-dimensional CCD camera 11 constituting the level position measuring means 13 is also used for measuring a crystal diameter, the cost of manufacturing the apparatus for pulling a single crystal can be held down. In addition, by using the apparatus for pulling a single crystal according to the embodiment, having the automatic updating means 18 to automate the activity of working out a conversion equation of the mirror image position of the reference reflector 12 in the actual placed position to the level position, it is possible to automatically find the conversion equation before crystal pulling using the automatic updating means 18.

EXAMPLES AND COMPARATIVE EXAMPLES

An example of the level position control actually conducted using an exemplary apparatus for pulling a single crystal according to the present invention is described. The exemplary apparatus for pulling a single crystal, based on the apparatus shown in FIG. 1, has the following characteristics:

Internal diameter of the crucible 21: 22 inches;
Weight of material for forming a single crystal: 100 kg;
Mean diameter of the single crystal 36: 8 inches;
Distance between the reference reflector 12 and the main body 36c of the single crystal 36: 22 mm or more;
Period of time for averaging in the averaging means 14: 10 minutes; and
Criteria for judgement in the adjustment value addition propriety judging means 16
: the upper and lower limits of the crystal diameter are within the range of ±2 mm to a desired diameter of the main body 36c,
: the upper and lower limits of the level position are within the range of ±5 mm to the initial level position,
: the lower limit of the distance between the single crystal 36 and the reference reflector 12 is 22 mm, and
: the upper and lower limits of the crucible rotational speed are within the range of ±10 rpm to the crucible rotational speed at an early stage of forming the main body 36c.

The conversion equation was obtained by the automatic updating means 18 whereby the level position was actually changed by moving the crucible 21 up and down after the melting of the material was finished and the initial level position was set, and the relationship between the mirror image position of the reference reflector 12 and the level position was made approximate to a straight line. The ascent/descent range of the crucible 21 at that time was set within the range of ±5 mm to the initial position.

In the settings of the Example, since the condition of the upper and lower limits of the crystal diameter was not satisfied during pulling the shoulder 36b, the level position control was conducted based on the output from the crucible ascent speed calculating means 9. However, the shoulder 36b was very small in volume, so that the error in controlling the level position was very small. In the Example, it could be confirmed that it was possible to control the level position during pulling the single crystal 36 within the range of ±1 mm to the initial level position.

What is claimed is:

1. A method for pulling a single crystal with an apparatus having an apparatus body, a crucible in the apparatus body for holding a melt, a lifting device for lifting the crucible, a reference reflector located inside the apparatus body, and an optical device located outside of the apparatus body, said method comprising:

forming a melt of a material for the single crystal;

partially melting a front portion of a seed crystal in the melt;

forming a neck;

forming a shoulder;

forming a main body of the single crystal having a uniform diameter and a prescribed length;

measuring a diameter of the main body of the single crystal while forming the main body;

calculating a decrease in volume of the melt in the crucible based on the diameter of the main body of the single crystal and a pulled crystal length of the single crystal;

calculating an ascent speed of the crucible based on the decrease in volume of the melt;

measuring an actual level position of the melt by detecting a mirror image position of the reference reflector reflected by a surface of the melt using the optical device;

calculating an adjustment value of the ascent speed of the crucible based on the actual level position;

judging whether criteria are satisfied for adding the adjustment value to the ascent speed, wherein the criteria are the diameter of the main body of the single crystal, the actual level position, a distance between the main body of the single crystal and the reference reflector, and a crucible rotation speed; and controlling a level position of the crucible based on the ascent speed to which the adjustment value was added when the criteria are satisfied, and controlling the level position of the crucible based on just the ascent speed when the criteria are not satisfied.

2. A method according to claim 1, wherein said measuring of the diameter of the main body of the single crystal uses the optical device.

3. A method according to claim 1, further comprising updating a conversion equation for converting the mirror image position of the reference reflector on the surface of the melt to the actual level position by moving the crucible up and down from an initial position to obtain a relationship between the mirror image position of the reference reflector on the surface of the melt and the actual level position, the relationship being approximate to a straight line.

4. A method according to claim 1, wherein said measuring of the actual level position of the melt uses a first camera of the optical device and said measuring of the main body of the diameter of the single crystal uses a second camera of the optical device.

5. A method according to claim 1, further comprising averaging a plurality of level positions measured by said measuring of the actual level position and using the averaged level position as the actual level position.

* * * * *